(12) United States Patent
Tseng et al.

(10) Patent No.: US 11,114,782 B2
(45) Date of Patent: Sep. 7, 2021

(54) METHOD OF MANUFACTURING CIRCUIT BOARD STRUCTURE

(71) Applicant: Unimicron Technology Corp., Taoyuan (TW)

(72) Inventors: Tzyy-Jang Tseng, Hsinchu (TW); Pei-Wei Wang, Taipei (TW); Ching-Ho Hsieh, Taoyuan (TW); Shao-Chien Lee, Taoyuan (TW); Kuo-Wei Li, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/540,038

(22) Filed: Aug. 13, 2019

(65) Prior Publication Data

US 2020/0366012 A1    Nov. 19, 2020

(30) Foreign Application Priority Data

May 14, 2019  (TW) .................................. 108116615

(51) Int. Cl.
*H05K 1/02*  (2006.01)
*H01R 12/62*  (2011.01)
*H05K 1/14*  (2006.01)
*H05K 1/11*  (2006.01)
*H05K 1/03*  (2006.01)
(Continued)

(52) U.S. Cl.
CPC .......... *H01R 12/62* (2013.01); *H05K 1/0277* (2013.01); *H05K 1/036* (2013.01); *H05K 1/115* (2013.01); *H05K 1/14* (2013.01); *H05K 3/0011* (2013.01); *H05K 3/4038* (2013.01); *H05K 3/4644* (2013.01); *H05K 2201/015* (2013.01);
(Continued)

(58) Field of Classification Search
CPC ... H05K 1/00; H05K 1/11; H05K 1/14; H05K 1/111–114; H05K 1/141–144; H05K 1/18; H05K 1/181–188; H05K 3/46; H05K 3/4682–4688
USPC .......... 361/749, 775–778, 803; 174/254–260
See application file for complete search history.

(56) References Cited

U.S. PATENT DOCUMENTS 5,121,297 A * 6/1992 Haas .................... H05K 3/4691
                                                174/254
5,206,463 A * 4/1993 DeMaso .............. H05K 3/4691
                                                174/254
(Continued)

FOREIGN PATENT DOCUMENTS

CN    101785373 A    7/2010
CN    102113425 A    6/2011
(Continued)

*Primary Examiner* — Tuan T Dinh
(74) *Attorney, Agent, or Firm* — CKC & Partners Co., LLC

(57) ABSTRACT

A circuit board structure has a first flexible circuit board, a second flexible circuit board, and a rigid board structure. The first flexible circuit board has a first dielectric layer and a first conductive circuit. The second flexible circuit board has a second dielectric layer and a second conductive circuit. The rigid board structure connects the first flexible circuit board and the second flexible circuit board. The rigid board structure has a third dielectric layer and a third conductive circuit. A dielectric loss value of the third dielectric layer is less than that of each of the first dielectric layer and the second dielectric layer. The third conductive circuit is electrically connected to the first and second conductive circuits.

4 Claims, 16 Drawing Sheets

(51) Int. Cl.
*H05K 3/00* (2006.01)
*H05K 3/40* (2006.01)
*H05K 3/46* (2006.01)

(52) U.S. Cl.
CPC ........... *H05K 2201/0141* (2013.01); *H05K 2201/0154* (2013.01); *H05K 2201/0158* (2013.01)

(56) References Cited

U.S. PATENT DOCUMENTS

| | | | |
|---|---|---|---|
| 5,239,448 A | 8/1993 | Perkins et al. | |
| 7,982,135 B2 | 7/2011 | Takahashi et al. | |
| 8,558,116 B2* | 10/2013 | Lee | H05K 3/386 |
| | | | 174/254 |
| 8,604,346 B2* | 12/2013 | Uratsuji | H05K 1/0218 |
| | | | 174/254 |
| 8,658,904 B2* | 2/2014 | Naganuma | H05K 3/4691 |
| | | | 174/255 |
| 9,066,439 B2* | 6/2015 | Segawa | H05K 1/142 |
| 9,661,743 B1* | 5/2017 | Bergman | H05K 1/0296 |
| 10,219,369 B2 | 2/2019 | Denda | |
| 2008/0099230 A1* | 5/2008 | Takahashi | H05K 3/4691 |
| | | | 174/250 |
| 2009/0071696 A1* | 3/2009 | Yang | C08G 73/14 |
| | | | 174/254 |
| 2010/0051326 A1* | 3/2010 | Sagisaka | H05K 1/141 |
| | | | 174/254 |
| 2011/0036619 A1* | 2/2011 | Uratsuji | H05K 1/0218 |
| | | | 174/254 |
| 2011/0120754 A1* | 5/2011 | Kondo | H01L 23/49833 |
| | | | 174/254 |
| 2011/0199739 A1* | 8/2011 | Naganuma | H05K 3/4691 |
| | | | 361/749 |
| 2015/0195921 A1* | 7/2015 | Onodera | C09K 19/3087 |
| | | | 174/258 |
| 2016/0107376 A1* | 4/2016 | Nakajima | B29C 65/4865 |
| | | | 428/216 |
| 2016/0197630 A1 | 7/2016 | Kawasaki | |
| 2018/0086025 A1* | 3/2018 | Yoshigahara | C08J 5/24 |

FOREIGN PATENT DOCUMENTS

| | | |
|---|---|---|
| CN | 102378489 A | 3/2012 |
| CN | 103796416 A | 5/2014 |
| CN | 107343354 A | 11/2017 |
| JP | 2005268365 A | 9/2005 |
| TW | 201223377 A | 6/2012 |
| TW | I407873 B | 9/2013 |
| TW | I604763 B | 11/2017 |
| TW | I622332 B | 4/2018 |

* cited by examiner

METHOD OF MANUFACTURING CIRCUIT BOARD STRUCTURE

CROSS-REFERENCE TO RELATED APPLICATION

This application claims priority to Taiwan Application Serial Number 108116615, filed May 14, 2019, which is herein incorporated by reference.

BACKGROUND

Field of Invention

The present disclosure relates to a circuit board structure and a manufacturing method thereof.

Description of Related Art

In response to the development trend of the printed circuit board industry, the design and development of high-frequency and high-speed circuit board and materials thereof have become the primary goal of future high-frequency and high-speed technology. However, there are still some shortcomings in the current high-frequency and high-speed circuit boards, such as signal transmission loss and heat dissipation.

Therefore, in order to meet the needs of future high-frequency and high-speed technology, it is necessary to propose solutions to those shortcomings such as signal transmission loss and heat dissipation in high-frequency and high-speed circuit boards.

SUMMARY

One aspect of the present disclosure is to provide a circuit board structure. The circuit board structure comprises a first flexible circuit board, a second flexible circuit board, and a rigid board structure. The first flexible circuit board comprises a first dielectric layer and a first conductive circuit on the first dielectric layer. The second flexible circuit board comprises a second dielectric layer and a second conductive circuit on the second dielectric layer. The first dielectric layer has a first dielectric loss value, and the second dielectric layer has a second dielectric loss value. The rigid board structure connects the first flexible circuit board and the second flexible circuit board, and has a thickness direction. The first flexible circuit board and the second flexible circuit board are not overlapped in the thickness direction. The rigid board structure comprises a third dielectric layer and a third conductive circuit. The third dielectric layer has a third dielectric loss value less than each of the first dielectric loss value and the second dielectric loss value. The third conductive circuit is disposed on the third dielectric layer and electrically connected to the first conductive circuit and the second conductive circuit.

In one embodiment of the present disclosure, a portion of the first flexible circuit board and a portion of the second flexible circuit board are covered by the rigid board structure.

In one embodiment of the present disclosure, the third dielectric layer comprises polytetrafluoroethylene, liquid crystal polymer, modified polyimide, hydrocarbon material, modified polyphenylene ether, or a combination thereof.

In one embodiment of the present disclosure, the first flexible circuit board further comprises a first cover layer partially covering the first conductive circuit, and a portion of the first cover layer is covered by the rigid board structure.

In one embodiment of the present disclosure, the second flexible circuit board further comprises a second cover layer partially covering the second conductive circuit, and a portion of the second cover layer is covered by the rigid board structure.

In one embodiment of the present disclosure, the rigid board structure further comprises a first conductive via and a second conductive via in the third dielectric layer, in which the third conductive circuit is electrically connected to the first conductive circuit and the second conductive circuit through the first conductive via and the second conductive via respectively.

In one embodiment of the present disclosure, the rigid board structure further comprises a fourth dielectric layer, a fourth conductive circuit, and a plurality of third conductive vias. The fourth dielectric layer is located on the third conductive circuit and has a fourth dielectric loss value less than each of the first dielectric loss value and the second dielectric loss value. The fourth conductive circuit is disposed on the fourth dielectric layer. A plurality of third conductive vias is disposed in the fourth dielectric layer and electrically connecting the third conductive circuit to the fourth conductive circuit.

In one embodiment of the present disclosure, the circuit board structure further comprises a shielding layer covering an outer surface of the rigid board structure.

In one embodiment of the present disclosure, the third dielectric loss value ranges from 0.001 to 0.002.

The present disclosure also provides a method of manufacturing circuit board structure. The method comprises the following steps. First, a first flexible circuit board and a second flexible circuit board are provided. The first flexible circuit board comprises a first dielectric layer and a first conductive circuit on the first dielectric layer. The second flexible circuit board comprises a second dielectric layer and a second conductive circuit on the second dielectric layer. The first dielectric layer has a first dielectric loss value, and the second dielectric layer has a second dielectric loss value.

Next, a rigid board structure connecting the first flexible circuit board and the second flexible circuit board is disposed. The rigid board structure comprises a third dielectric layer, a first metal layer, a first hole, and a second hole. The third dielectric layer has a third dielectric loss value less than each of the first dielectric loss value and the second dielectric loss value. The first metal layer is located on the third dielectric layer. The first hole and the second hole are both located in the third dielectric layer and penetrate through the first metal layer. The first hole exposes the first conductive circuit, and the second hole exposes and the second conductive circuit.

Next, a first conductive plug is formed in the first hole, and a second conductive plug is formed in the second hole. The first conductive plug is connected to the first conductive circuit, and the second conductive plug is connected to the second conductive circuit. Next, the first metal layer is patterned to form a first patterned metal layer.

In one embodiment of the present disclosure, the method further comprises forming a fourth dielectric layer and a second metal layer on the first patterned metal layer, in which the fourth dielectric layer is located between the first patterned metal layer and the second metal layer.

In one embodiment of the present disclosure, the method further comprises forming a plurality of third holes penetrating through the fourth dielectric layer and the second metal layer to expose the first patterned metal layer; forming a plurality of third conductive plugs filling the third holes; and patterning the second metal layer to form a second patterned metal layer.

In one embodiment of the present disclosure, the method further comprises disposing a shielding layer over the first patterned metal layer after forming the first patterned metal layer.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
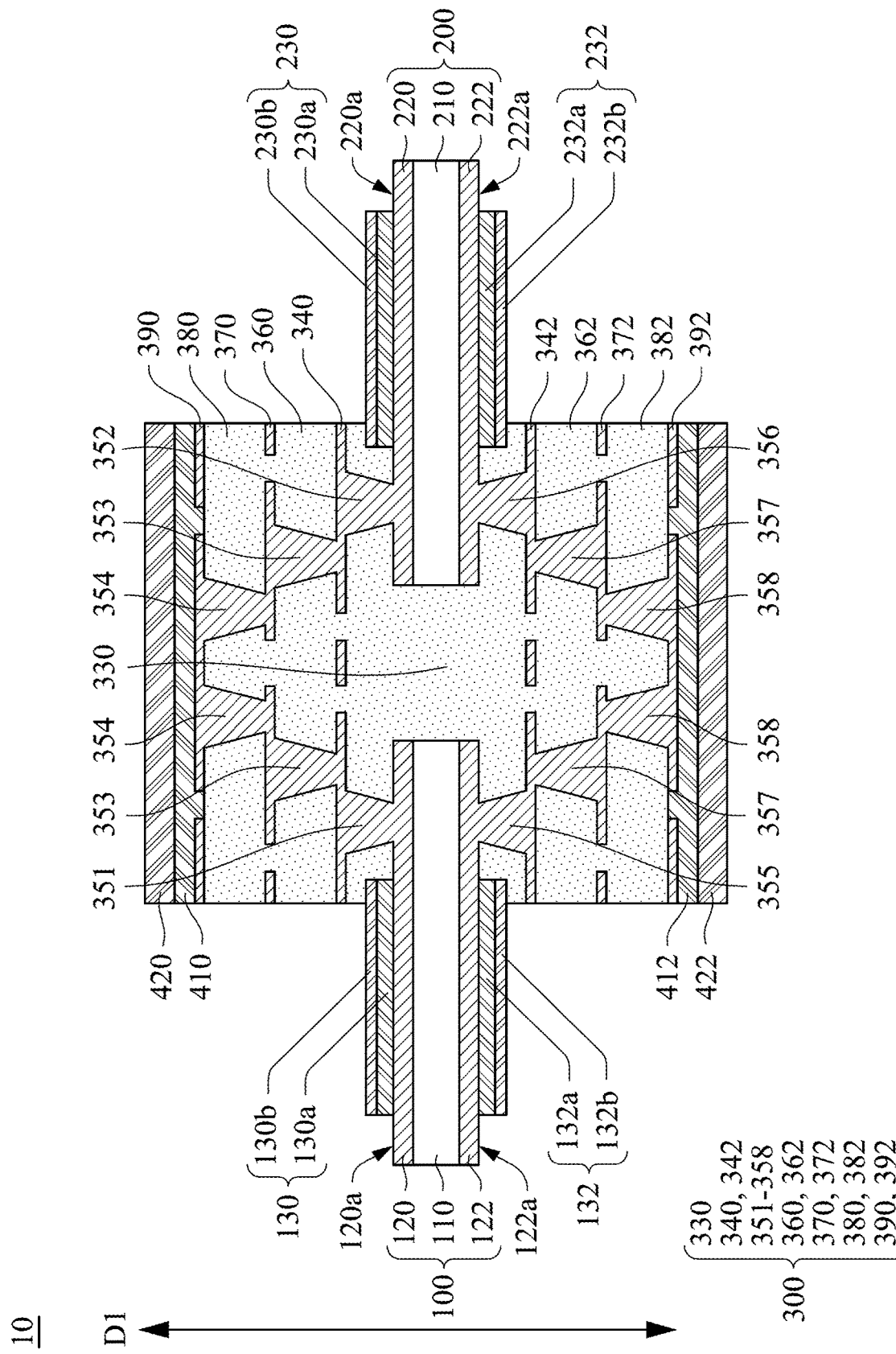
FIG. 1 illustrates a schematic sectional view of a circuit board structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. The embodiments disclosed below may be combined or substituted with each other in an advantageous situation, and other embodiments may be added to an embodiment without further description or explanation.

In the following description, numerous specific details are set forth in the following detailed description. However, embodiments of the present disclosure may be practiced without such specific details. In order to simplify the drawings, well-known structures and devices are only schematically illustrated in the figures.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Further, spatially relative terms, such as "on," "under," "over," "below" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One aspect of the present disclosure is to provide a circuit board structure 10. Reference is made to FIG. 1. The circuit board structure 10 comprises a first flexible circuit board 100, a second flexible circuit board 200, and a rigid board structure 300. The first flexible circuit board 100 comprises a first dielectric layer 110, a first upper conductive circuit 120, and a first lower conductive circuit 122. The first upper conductive circuit 120 and the first lower conductive circuit 122 are respectively disposed on opposite surfaces of the first dielectric layer 110. It is noted that in some other embodiments, the first flexible circuit board 100 may not include the first lower conductive circuit 122.

The second flexible circuit board 200 comprises a second dielectric layer 210, a second upper conductive circuit 220, and a second lower conductive circuit 222. The second upper conductive circuit 220 and the second lower conductive circuit 222 are respectively disposed on opposite surfaces of the second dielectric layer 210. It is noted that in some other embodiments, the second flexible circuit board 200 may not include the second lower conductive circuit 222.

The first dielectric layer 110 has a first dielectric loss value, and the second dielectric layer 210 has a second dielectric loss value. The first dielectric loss value and the second dielectric loss value may be the same or different. In some embodiments, the first dielectric loss value ranges from 0.003 to 0.01, and the second dielectric loss value ranges from 0.003 to 0.01. In some examples, the first dielectric layer 110 and the second dielectric layer 210 includes organic polymer material such as polyimide resin, phenolic resin, epoxy resin, bismaleimide triazine (BT) and/or a combination thereof. The first upper conductive circuit 120, the first lower conductive circuit 122, the second upper conductive circuit 220, and the second lower conductive circuit 222 may include any conductive material, such as copper, aluminum, nickel, silver, gold or an alloy thereof.

In one embodiment of the present disclosure, the first flexible circuit board 100 further comprises a first upper cover layer 130. The first upper cover layer 130 is disposed on an upper surface 120a of the first upper conductive circuit 120. The first upper conductive circuit 120 is partially covered by the first upper cover layer 130. In one embodiment, the first upper cover layer 130 comprises a first upper adhesive layer 130a and a first upper insulating layer 130b, in which the first upper adhesive layer 130a is located between the first upper conductive circuit 120 and the first upper insulating layer 130b. In another embodiment of the present disclosure, the first flexible circuit board 100 further includes a first lower cover layer 132. The first lower cover layer 132 is disposed on an upper surface 122a of the first lower conductive circuit 122. The first lower conductive circuit 122 is partially covered by the first lower cover layer 132. The first lower cover layer 132 includes a first lower adhesive layer 132a and a first lower insulating layer 132b, in which the first lower adhesive layer 132a is located between the first lower conductive circuit 122 and the first lower insulating layer 132b.

In one embodiment of the present disclosure, the second flexible circuit board 200 further comprises a second upper cover layer 230. The second upper cover layer 230 is disposed on an upper surface 220a of the second upper conductive circuit 220. The second upper conductive circuit 220 is partially covered by the second upper cover layer 230. In one embodiment, the second upper cover layer 230 includes a second upper adhesive layer 230a and a second upper insulating layer 230b, in which the second upper adhesive layer 230a is located between the second upper conductive circuit 220 and the second upper insulating layer 230b. In another embodiment of the present disclosure, the second flexible circuit board 200 further comprises a second lower cover layer 232. The second lower cover layer 232 is disposed on an upper surface 222a of the second lower conductive circuit 222. The second lower conductive circuit 222 is partially covered by the second lower cover layer 232. The second lower cover layer 232 includes a second lower adhesive layer 232a and a second lower insulating layer 232b, in which the second lower adhesive layer 232a is located between the second lower conductive circuit 222 and the second lower insulating layer 232b.

The rigid board structure 300 connects the first flexible circuit board 100 and the second flexible circuit board 200 and has a thickness direction D1. It is noted that the first flexible circuit board 100 and the second flexible circuit board 200 are not overlapped in the thickness direction D1 of the rigid board structure 300. The rigid board structure 300 includes a third dielectric layer 330 and a third upper conductive circuit 340. In some other embodiments of the present disclosure, the rigid board structure 300 further includes a third lower conductive circuit 342. The third upper conductive circuit 340 and the third lower conductive circuit 342 is disposed on opposite sides of the third dielectric layer 330.

The third dielectric layer 330 has a third dielectric loss value. In some embodiments, the third dielectric loss value ranges from 0.001 to 0.002. It is noted that the third dielectric loss value is less than each of the first dielectric loss value and the second dielectric loss value. In some examples, the third dielectric layer 330 comprises polytetrafluoroethylene, liquid crystal polymer, modified polyimide, hydrocarbon material, modified polyphenylene ether, or a combination thereof.

The third upper conductive circuit 340 is disposed on the third dielectric layer 330 and electrically connected to the first upper conductive circuit 120 and the second upper conductive circuit 220. In some examples, the third upper conductive circuit 340 may include any conductive material, such as copper, aluminum, nickel, silver, gold or an alloy thereof.

In one embodiment of the present disclosure, a portion of the first flexible circuit board 100 and a portion of the second flexible circuit board 200 are partially covered by the rigid board structure 300. Specifically, the upper surface 120a of the first upper conductive circuit 120 and the upper surface 220a of the second upper conductive circuit 220 are partially covered by the third dielectric layer 330 of the rigid board structure 300. In another embodiment, the first upper cover layer 130 and the second upper cover layer 230 are also partially covered by the third dielectric layer 330 of the rigid board structure 300.

In one embodiment of the present disclosure, the rigid board structure 300 further comprises a first conductive via 351 and a first conductive via 352. The first conductive via 351 and the first conductive via 352 are located in the third dielectric layer 330. The third upper conductive circuit 340 is electrically connected to the first upper conductive circuit 120 and the second upper conductive circuit 220 through the first conductive via 351 and the first conductive via 352 respectively. In some examples, the first conductive via 351 and the first conductive via 352 may include any conductive material, such as copper, aluminum, nickel, silver, gold or an alloy thereof.

In another embodiment of the present disclosure, the rigid board structure 300 further includes a fourth upper dielectric layer 360, a fourth upper conductive circuit 370, and a plurality of third conductive vias 353. The fourth upper dielectric layer 360 is located on the third upper conductive circuit 340 and has a fourth dielectric loss value. The fourth dielectric loss value is less than each of the first dielectric loss value and the second dielectric loss value. In one embodiment, the fourth dielectric loss value is equal to the third dielectric loss value, but the present disclosure is not limited thereto. The fourth upper conductive circuit 370 is disposed on the fourth upper dielectric layer 360. The third conductive vias 353 are located in the fourth upper dielectric layer 360 and electrically connected to the third upper conductive circuit 340 and the fourth upper conductive circuit 370. In yet another embodiment of the present disclosure, the rigid board structure 300 further includes a fifth upper dielectric layer 380, a fifth upper conductive circuit 390, and a plurality of fourth conductive vias 354. The fourth conductive vias 354 are located in the fifth upper dielectric layer 380 and electrically connected to the fourth upper conductive circuit 370 and the fifth upper conductive circuit 390. In some examples, the third conductive vias 353 and the fourth conductive vias 354 are made of similar material to the first conductive via 351, and therefore are not repeated herein.

In yet another embodiment of the present disclosure, the rigid board structure 300 further includes a fifth conductive via 355 and a sixth conductive via 356. The fifth conductive via 355 and the sixth conductive via 356 are located in the third dielectric layer 330. The third lower conductive circuit 342 is electrically connected to the first lower conductive circuit 122 and the second lower conductive circuit 222 through the fifth conductive via 355 and the sixth conductive via 356 respectively. In some examples, the fifth conductive via 355 and the sixth conductive via 356 are made of similar material to the first conductive via 351, and therefore are not repeated herein.

In another embodiment of the present disclosure, the rigid board structure 300 further includes a fourth lower dielectric layer 362, a fourth lower conductive circuit 372, and a plurality of seventh conductive vias 357. The fourth lower dielectric layer 362 is located on the third lower conductive circuit 342. In one embodiment, the dielectric loss value of the fourth upper dielectric layer 360 is equal to the dielectric loss value of the fourth lower dielectric layer 362, but is not limited thereto. The fourth lower conductive circuit 372 is disposed on the fourth lower dielectric layer 362. The seventh conductive vias 357 is located in the fourth lower dielectric layer 362 and electrically connected to the third lower conductive circuit 342 and the fourth lower conductive circuit 372. In yet another embodiment of the present disclosure, the rigid board structure 300 further includes a fifth lower dielectric layer 382, a fifth lower conductive circuit 392, and a plurality of eighth conductive vias 358. The eighth conductive vias 358 are located in the fifth lower dielectric layer 382 and electrically connected to the fourth lower conductive circuit 372 and the fifth lower conductive circuit 392. In some examples, the seventh conductive vias 357 and the eighth conductive vias 358 are made of similar material to the first conductive via 351, and therefore are not repeated herein. In some examples, the fifth upper conductive circuit 390 and the fifth lower conductive circuit 392 are made of similar material to the third upper conductive circuit 340, and therefore are not repeated herein.

In one embodiment of the present disclosure, the circuit board structure 10 further includes a sixth dielectric layer 410 on the fifth upper conductive circuit 390 and a seventh dielectric layer 412 on the fifth lower conductive circuit 392. The sixth dielectric layer 410 and the seventh dielectric layer 412 are made of similar material to the third dielectric layer 330, and therefore are not repeated herein.

In one embodiment of the present disclosure, the circuit board structure 10 further includes a first shielding layer 420 and/or a second shielding layer 422 respectively covering two outer surfaces of the rigid board structure 300. Specifically, the first shielding layer 420 is disposed on the sixth dielectric layer 410, and the second shielding layer 422 is disposed on the seventh dielectric layer 412. The material of the first shielding layer 420 and/or the second shielding layer 422 may comprise silver foil (Tatsuta), silver paste (Toyobo, ASAHI), conductive paste, conductive foam, conductive aluminum foil tape, conductive copper foil tape, conductive fabric tape, etc.

Figure 2:
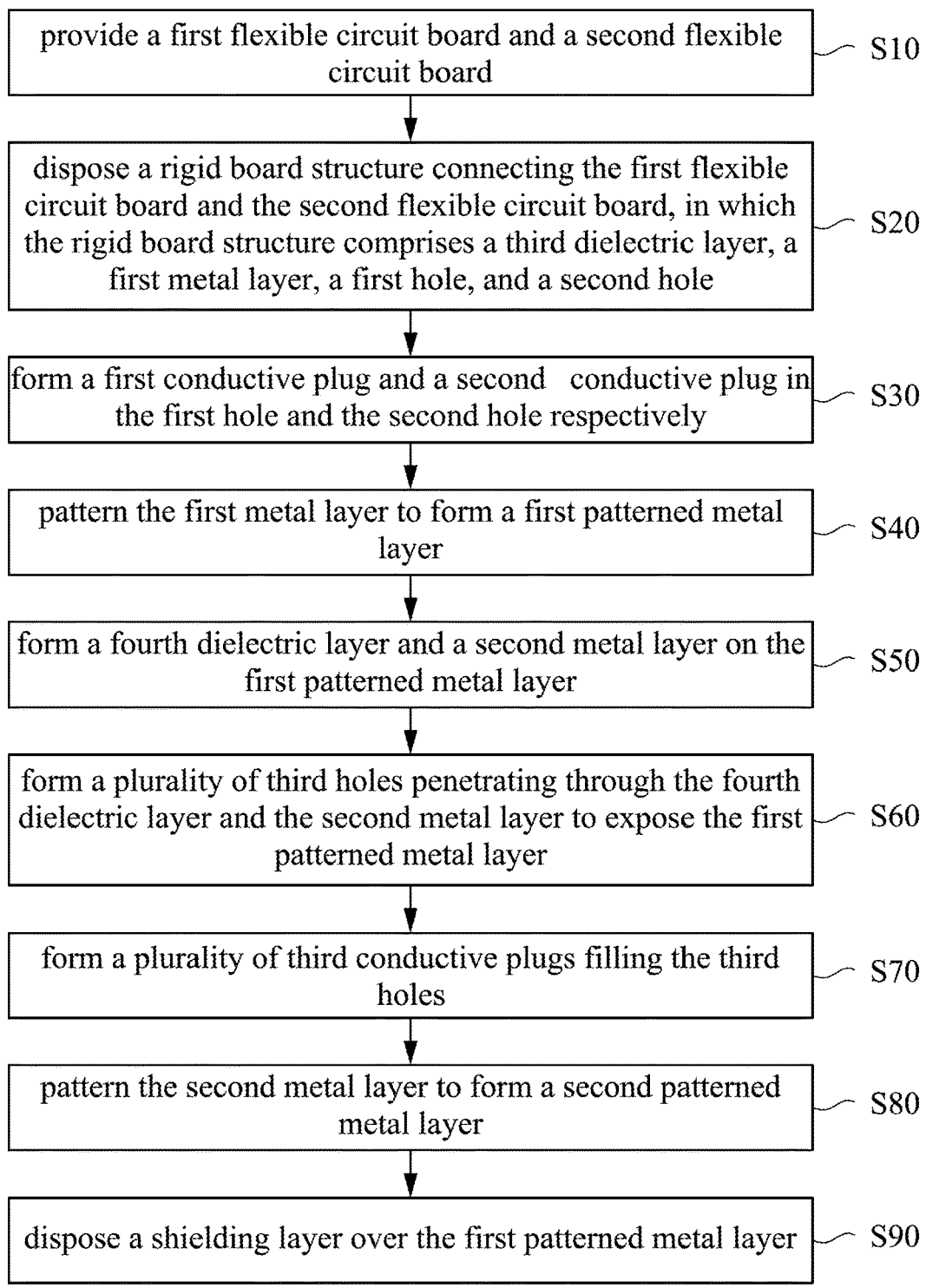
FIG. 2 illustrates a flow chart of a method of manufacturing circuit board structure according to some embodiments of the present disclosure.
Figure 3:
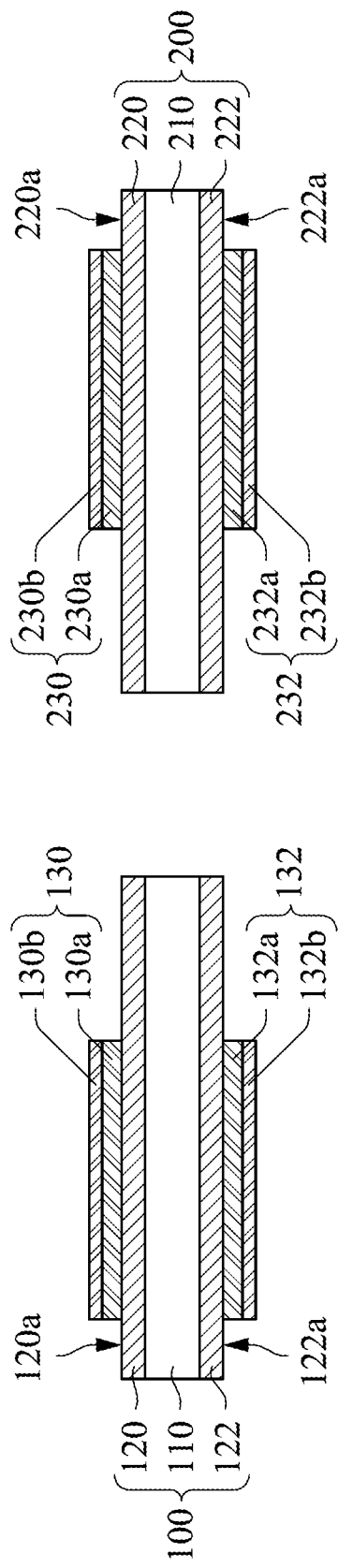
FIG. 3 to FIG. 16 are schematic sectional views illustrating various process stages of a method of manufacturing circuit board structure according to one embodiment of the present disclosure.

Another aspect of the present disclosure is to provide a method of manufacturing circuit board structure. The circuit board structure obtained by the manufacturing method has low signal transmission loss and is suitable for operation of high frequency and high speed circuit boards. FIG. 2 illustrates a flow chart of a method 20 of manufacturing a circuit board structure 10 according to some embodiments of the present disclosure. FIG. 3 to FIG. 16 are schematic sectional views illustrating various process stages of method 20. As shown in FIG. 2, method 20 includes step S10 to step S90. At step S10, a first flexible circuit board and a second flexible circuit board are provided. As shown in FIG. 3, a first flexible circuit board 100 and a second flexible circuit board 200 are provided. The first flexible circuit board 100 includes a first dielectric layer 110, a first upper conductive circuit 120, and a first lower conductive circuit 122. The second flexible circuit board 200 includes a second dielectric layer 210, a second upper conductive circuit 220, and a second lower conductive circuit 222. It is noted that in some other embodiments, the first flexible circuit board 100 may not include the first lower conductive circuit 122, and the second flexible circuit board 200 may not include the second lower conductive circuit 222. The materials of the first dielectric layer 110, the first upper conductive circuit 120, the first lower conductive circuit 122, the second dielectric layer 210, the second upper conductive circuit 220, and the second lower conductive circuit 222 have been described above, and therefore are not repeated herein.

In one embodiment of the present disclosure, the first flexible circuit board 100 further comprises a first upper cover layer 130. The first upper cover layer 130 is disposed on an upper surface 120a of the first upper conductive circuit 120. The first upper conductive circuit 120 is partially covered by the first upper cover layer 130. The first upper cover layer 130 includes a first upper adhesive layer 130a and a first upper insulating layer 130b, in which the first upper adhesive layer 130a is located between the first upper conductive circuit 120 and the first upper insulating layer 130b. In another embodiment of the present disclosure, the second flexible circuit board 200 further includes a second upper cover layer 230. The second upper cover layer 230 is disposed on an upper surface 220a of the second upper conductive circuit 220. The second upper conductive circuit 220 is partially covered by the second upper cover layer 230. The second upper cover layer 230 includes a second upper adhesive layer 230a and a second upper insulating layer 230b, in which the second upper adhesive layer 230a is located between the second upper conductive circuit 220 and the second upper insulating layer 230b.

Figure 4:
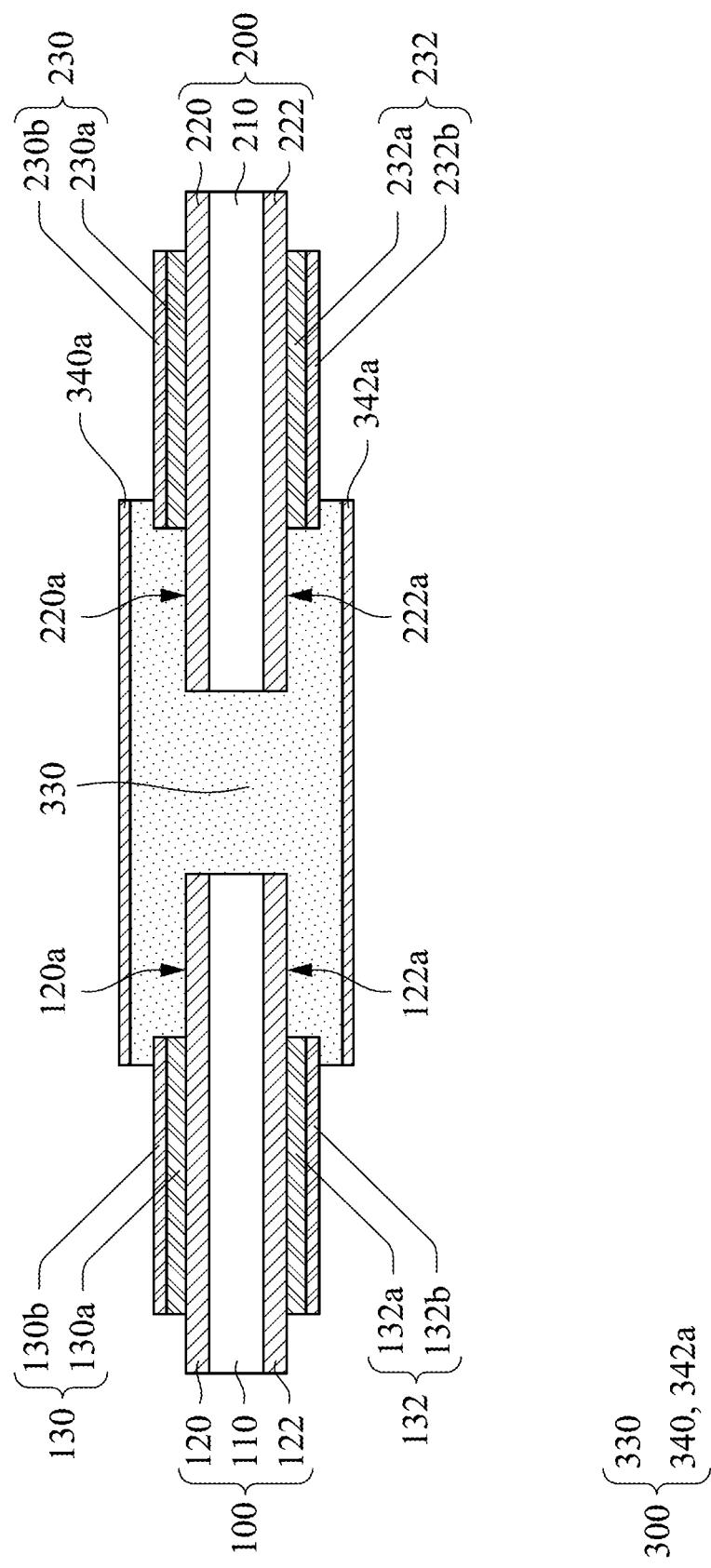
Figure 5:
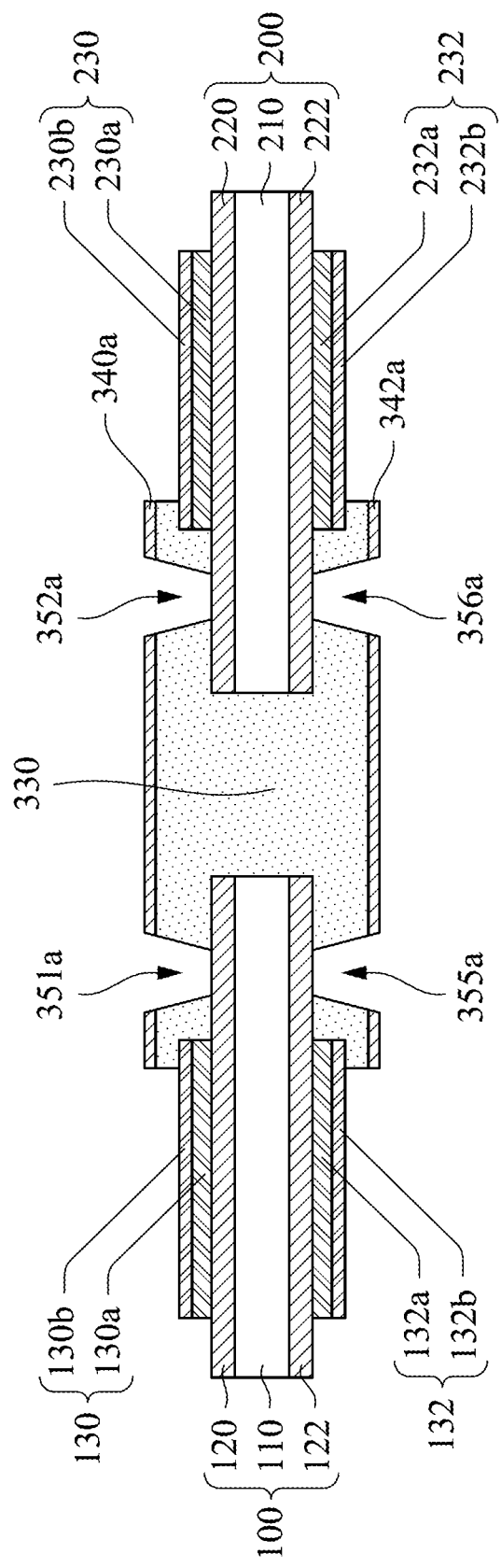

Next, referring to step S20, a rigid board structure connecting the first flexible circuit board and the second flexible circuit board is disposed. In detail, FIG. 4 and FIG. 5 illustrate details of implementing step S20 according to one embodiment of the present disclosure. As shown in FIG. 4, the rigid board structure 300 includes a third dielectric layer 330, a first upper metal layer 340a, and a first lower metal layer 342a. The first upper metal layer 340a and the first lower metal layer 342a are respectively disposed on opposite surfaces of the third dielectric layer 330. In one embodiment, a portion of the first flexible circuit board 100 and a portion of the second flexible circuit board 200 are covered by the third dielectric layer 330 of the rigid board structure 300. In another embodiment, the first upper cover layer 130 and the second upper cover layer 230 are also partially covered by the third dielectric layer 330 of the rigid board structure 300.

The approach of disposing the rigid board structure 300 includes but not limited to first forming the third dielectric layer 330 between the first flexible circuit board 100 and the second flexible circuit board 200, and then respectively forming the first upper metal layer 340a and the first lower metal layer 342a on opposite surfaces of the third dielectric layer 330. The formation of the third dielectric layer 330 includes but not limited to a pressing process, such as a lamination process or any other suitable processes. The formation of the first upper metal layer 340a and the first lower metal layer 342a includes but not limited to pressing process, electroplating process, chemical vapor deposition, physical vapor deposition, or any other suitable processes.

The materials of the third dielectric layer 330 have been described above, and therefore are not repeated herein. It is noted that the third dielectric loss value of the third dielectric layer 330 is less than each of the first dielectric loss value and the second dielectric loss value. In one embodiment, the first upper metal layer 340a and the first lower metal layer 342a may include any conductive material, such as copper, aluminum, nickel, silver, gold or an alloy thereof.

Next, a first hole 351a and a second hole 352a are formed in the rigid board structure 300, as shown in FIG. 5. The first hole 351a and the second hole 352a are located in the third dielectric layer 330 and penetrate through the first upper metal layer 340a. The first hole 351a exposes the first upper conductive circuit 120, and the second hole 352a exposes the second upper conductive circuit 220. The formation of the first hole 351a and the second hole 352a includes but not limited to performing an exposure and developing process on the first upper metal layer 340a, such that openings are formed on specific sites on the first upper metal layer 340a for subsequent formation of the first hole 351a and the second hole 352a, and then using a laser ablation process to form the first hole 351a and the second hole 352a in the third dielectric layer 330.

In some other embodiments, step S20 also includes forming a fifth hole 355a and a sixth hole 356a in the rigid board structure 300, as shown in FIG. 5. The fifth hole 355a and the sixth hole 356a are located in the third dielectric layer 330 and penetrate through the first lower metal layer 342a. The fifth hole 355a exposes the first lower conductive circuit 122, and the sixth hole 356a exposes the second lower conductive circuit 222. The formation of the fifth hole 355a and the sixth hole 356a are similar to that of the first hole 351a, and therefore are not repeated herein.

Figure 6:
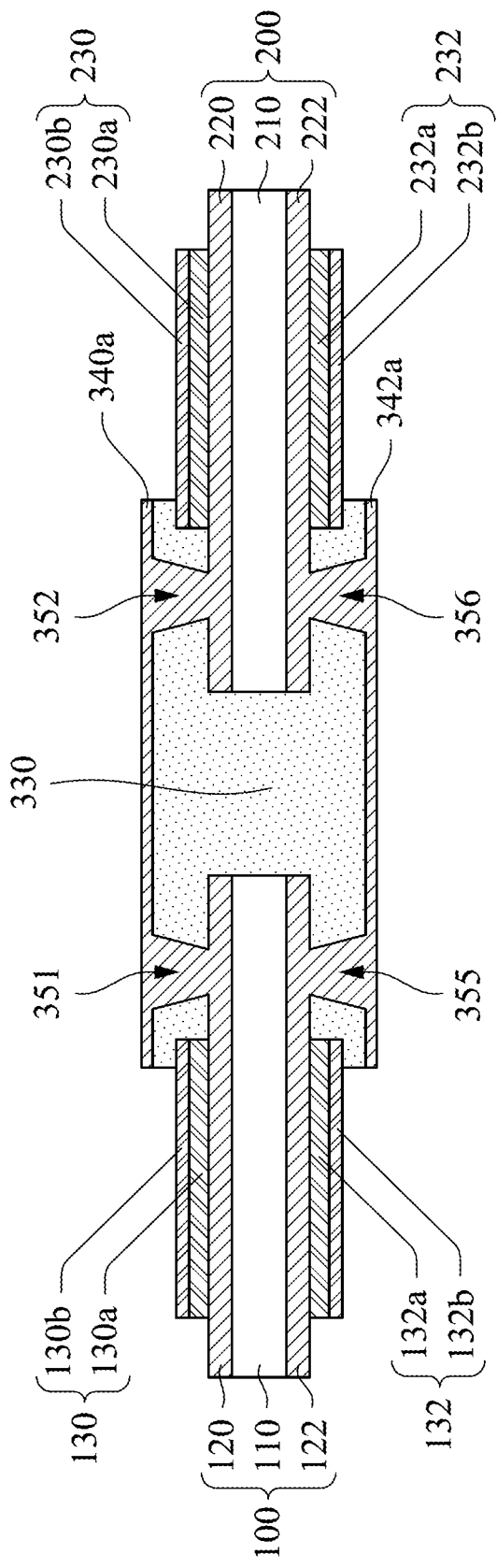

Next, step S30 is performed. As shown in FIG. 6, a first conductive plug 351 is formed in the first hole 351a, and a second conductive plug 352 is formed in the second hole 352a. In other words, the first hole 351a is filled with the first conductive plug 351, and the second hole 352a is filled with the second conductive plug 352. The first conductive plug 351 is connected to the first upper conductive circuit 120, and the second conductive plug 352 is connected to the second upper conductive circuit 220. In some other embodiments, step S30 further includes forming a fifth conductive plug 355 in the fifth hole 355a and a sixth conductive plug 356 in the sixth hole 356a, as shown in FIG. 6. Each hole and the conductive plug filled inside the hole composite a conductive via. In some examples, the first conductive plug 351, the second conductive plug 352, the fifth conductive plug 355, and the sixth conductive plug 356 may include any conductive material, such as copper, aluminum, nickel, silver, gold or an alloy thereof.

Figure 7:
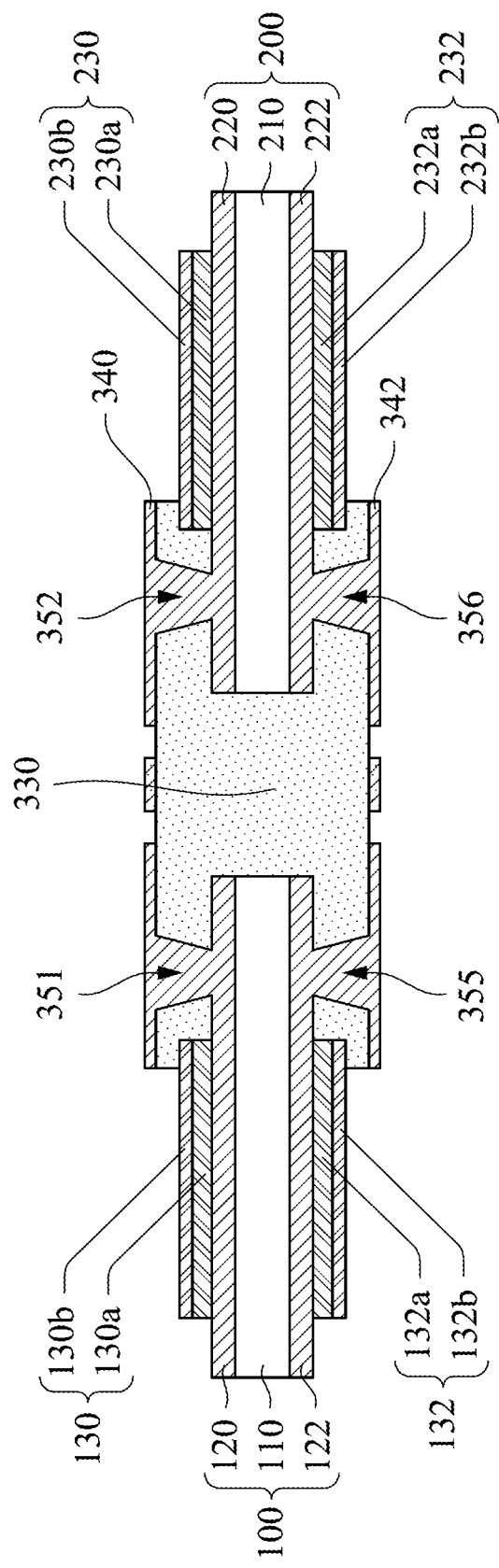

Next, step S40 is performed. As shown in FIG. 7, the first upper metal layer 340a is patterned to form a first patterned upper metal layer 340. In some embodiments, the formation of the first patterned upper metal layer 340 includes but not limited to first forming a photoresist layer (not shown) on the first upper metal layer 340a, and then forming a patterned photoresist layer by an exposure and developing process to expose a portion of the first upper metal layer 340a. Next, using the patterned photoresist layer as an etch mask, the first upper metal layer 340a is etched to form the first patterned upper metal layer 340, and the patterned photoresist layer is then removed.

In some other embodiments, step S40 also includes patterning the first lower metal layer 342a to form a first patterned lower metal layer 342. The formation of the first patterned lower metal layer 342 is similar to that of the first patterned upper metal layer 340, and therefore is not repeated herein. As shown in FIG. 7, the first patterned upper metal layer 340 and the first patterned lower metal layer 342 each exposes a portion of the third dielectric layer 330.

Figure 8:
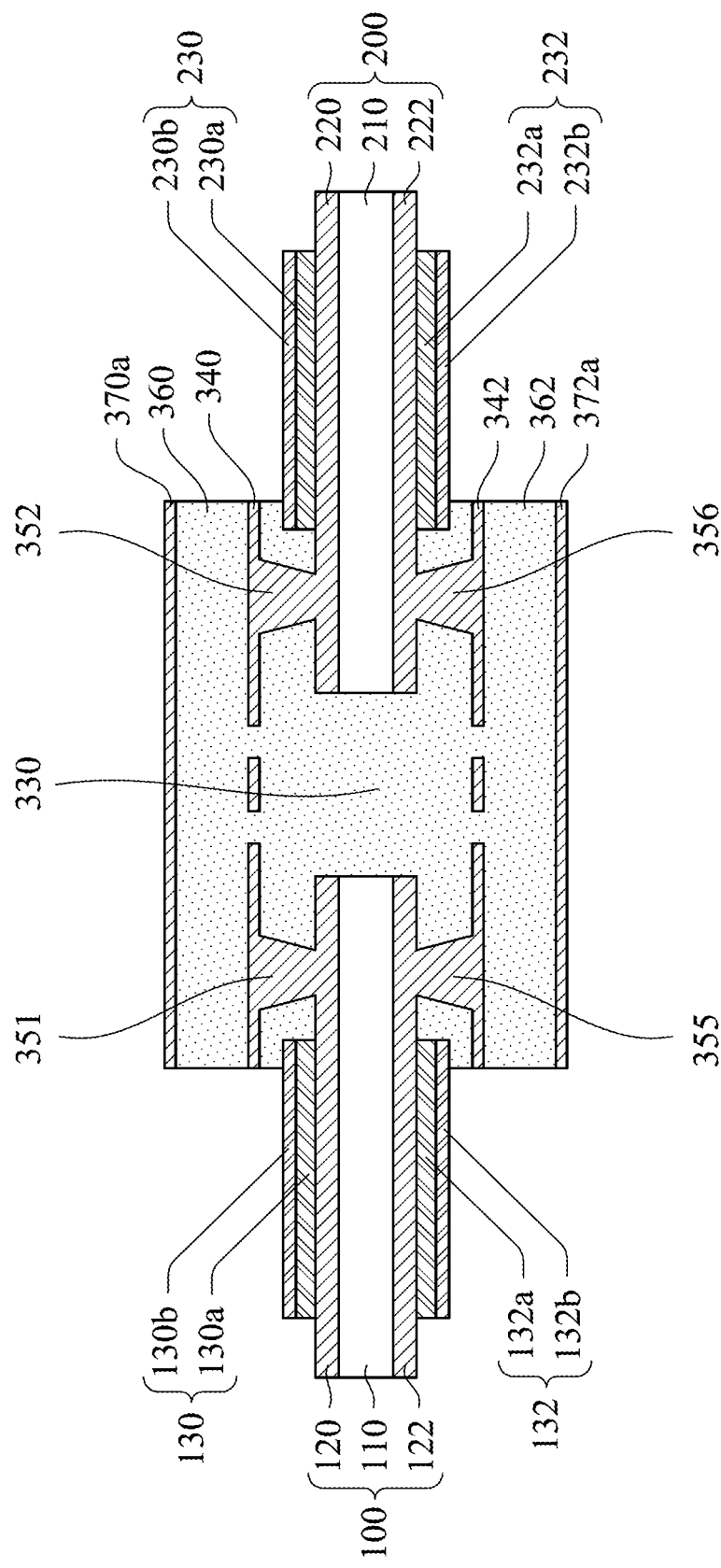

Next, step S50 is performed. As shown in FIG. 8, a fourth upper dielectric layer 360 and a second upper metal layer 370a are formed over the first patterned upper metal layer 340. The fourth upper dielectric layer 360 is located between the first patterned upper metal layer 340 and the second upper metal layer 370a. In some other embodiments, step S50 includes forming a fourth lower dielectric layer 362 and a second lower metal layer 372a over the first patterned lower metal layer 342, as shown in FIG. 8. The fourth lower dielectric layer 362 is located between the first patterned lower metal layer 342 and the second lower metal layer 372a.

The formation and materials of the fourth upper dielectric layer 360 and the fourth lower dielectric layer 362 are similar to those of the third dielectric layer 330, and therefore are not repeated herein. The formation and materials of the second upper metal layer 370a and the second lower metal layer 372a are similar to those of the first upper metal layer 340a, and therefore are not repeated herein.

Figure 9:
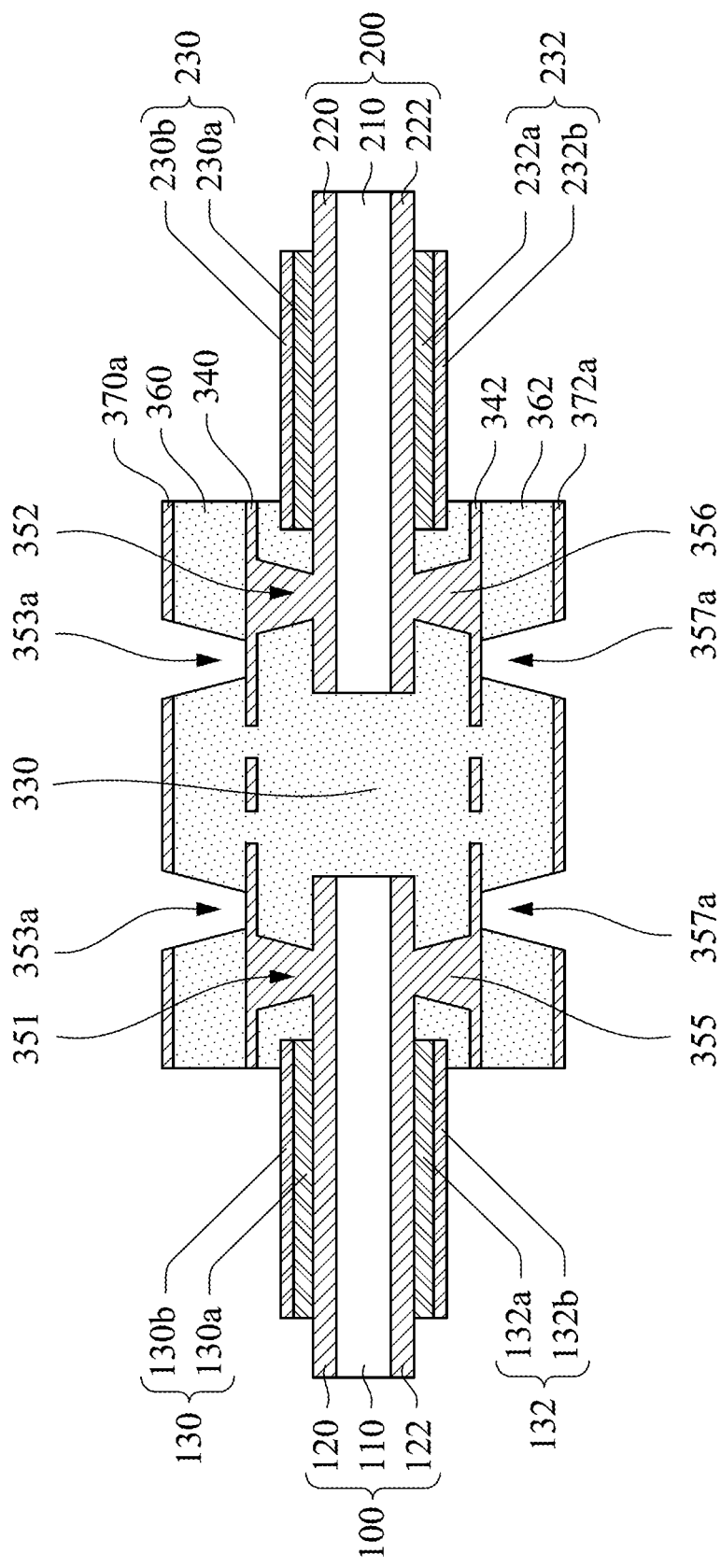

Next, step S60 is performed. As shown in FIG. 9, a plurality of the third holes 353a are formed and penetrating through the fourth upper dielectric layer 360 and the second upper metal layer 370a to expose the first patterned upper metal layer 340. In some other embodiments, step S60 also includes forming a plurality of the seventh holes 357a penetrating through the second lower metal layer 372a and the fourth lower dielectric layer 362 to expose the first patterned lower metal layer 342. The formation of the third holes 353a and the seventh holes 357a are similar to the formation of the first hole 351a, and therefore are not repeated herein.

Figure 10:
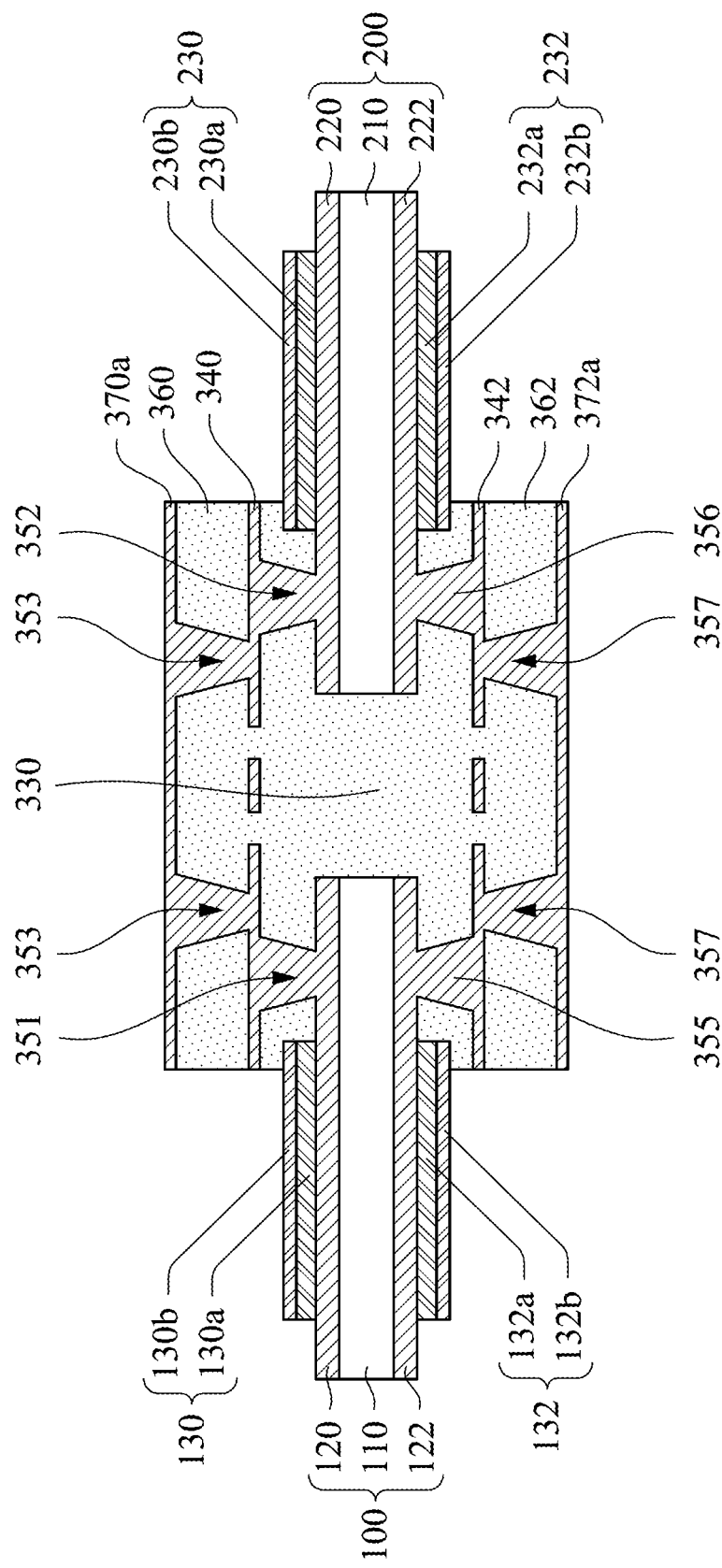

Step S70 is performed subsequently. As shown in FIG. 10, a plurality of third conductive plugs 353 are formed and filling the third holes 353a. The third conductive plugs 353 are electrically connected to the first patterned upper metal layer 340 and the second upper metal layer 370a. In some other embodiments, step S70 also includes forming a plurality of seventh conductive plugs 357 filling the seventh holes 357a, as shown in FIG. 10. The seventh conductive plugs 357 are electrically connected to the first patterned lower metal layer 342 and the second lower metal layer 372a. In some embodiments, the third conductive plugs 353, the seventh conductive plugs 357, and the first conductive plug 351 may comprise the same material, and therefore are not repeated herein.

Figure 11:
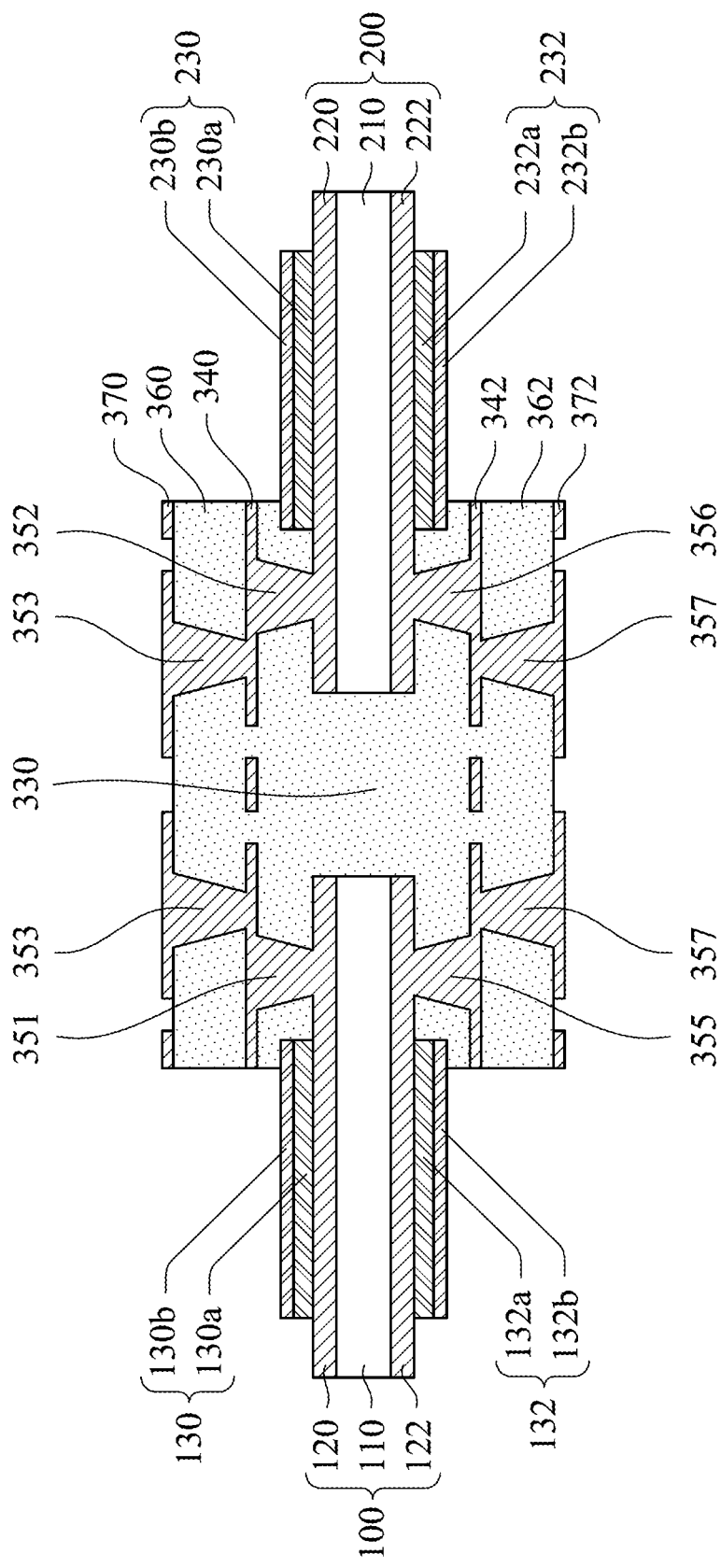

Step S80 is then performed. As shown in FIG. 11, the second upper metal layer 370a is patterned to form a second patterned upper metal layer 370. In some other embodiments, step S70 also includes patterning the second lower metal layer 372a to form a second patterned lower metal layer 372, as shown in FIG. 11. The formation of the second patterned upper metal layer 370 and the second patterned lower metal layer 372 are similar to the formation of the first patterned upper metal layer 340, and therefore are not repeated herein.

Figure 12:
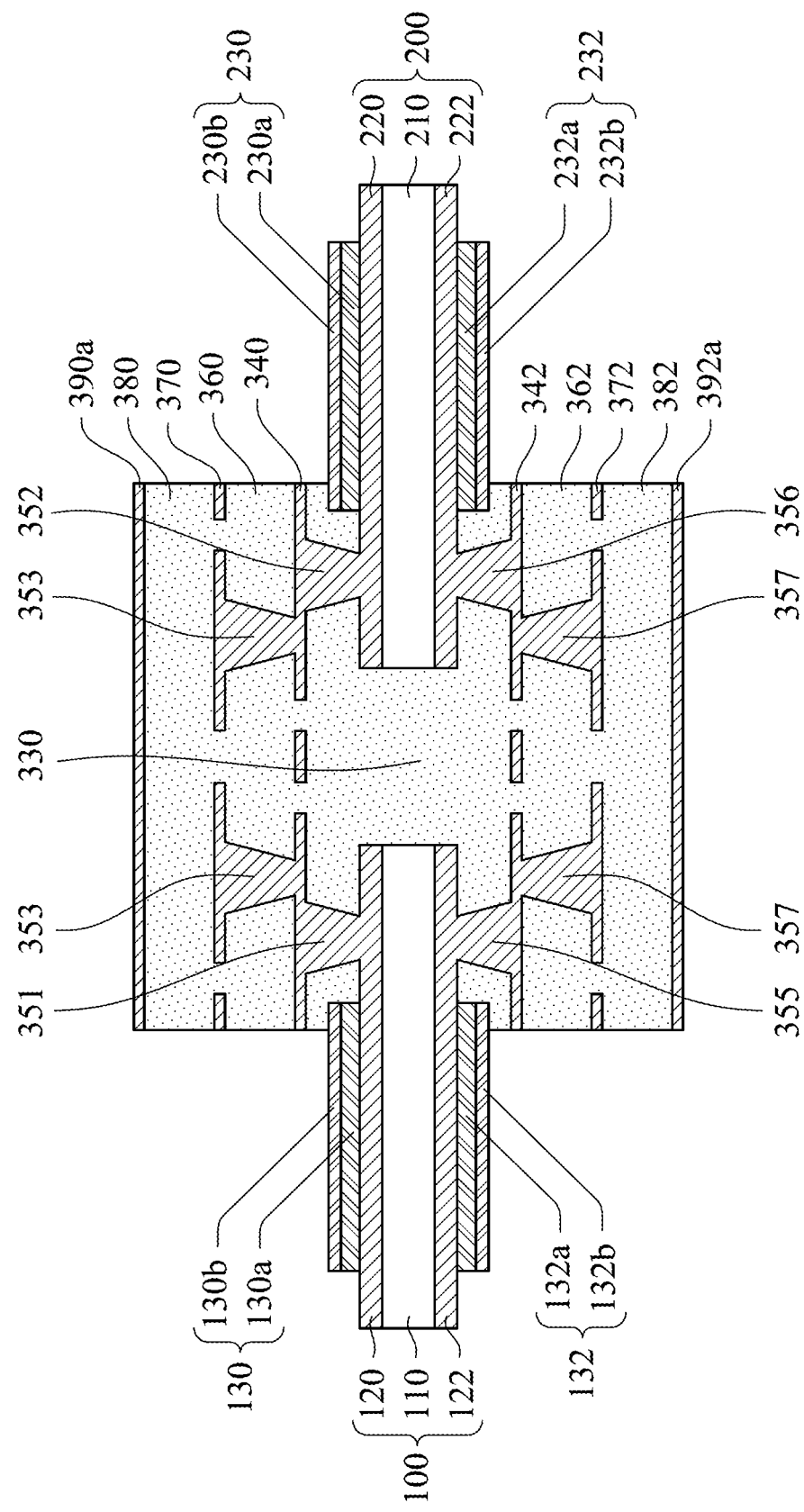

It is noted that the method of the present disclosure further comprises repeating step S50 to step S80 to form a plurality of dielectric layers and a plurality of patterned metal layers. In other words, the rigid board structure 300 may include one or more dielectric layer(s) and one or more patterned metal layer(s). For example, referring to FIG. 12, in some embodiments, the method of the present disclosure includes performing step S50 again after performing step S80 to form a fifth upper dielectric layer 380 and a third upper metal layer 390a over the second patterned upper metal layer 370, as shown in FIG. 12. In some other embodiments, the repeated step S50 also includes forming a fifth lower dielectric layer 382 and a third lower metal layer 392a over the second patterned lower metal layer 372. The formation and materials of the fifth upper dielectric layer 380 and the fifth lower dielectric layer 382 are similar to those of the third dielectric layer 330, and therefore are not repeated herein. The formation and materials of the third upper metal layer 390a and the third lower metal layer 392a are similar to those of the first upper metal layer 340a, and therefore are not repeated herein.

Figure 13:
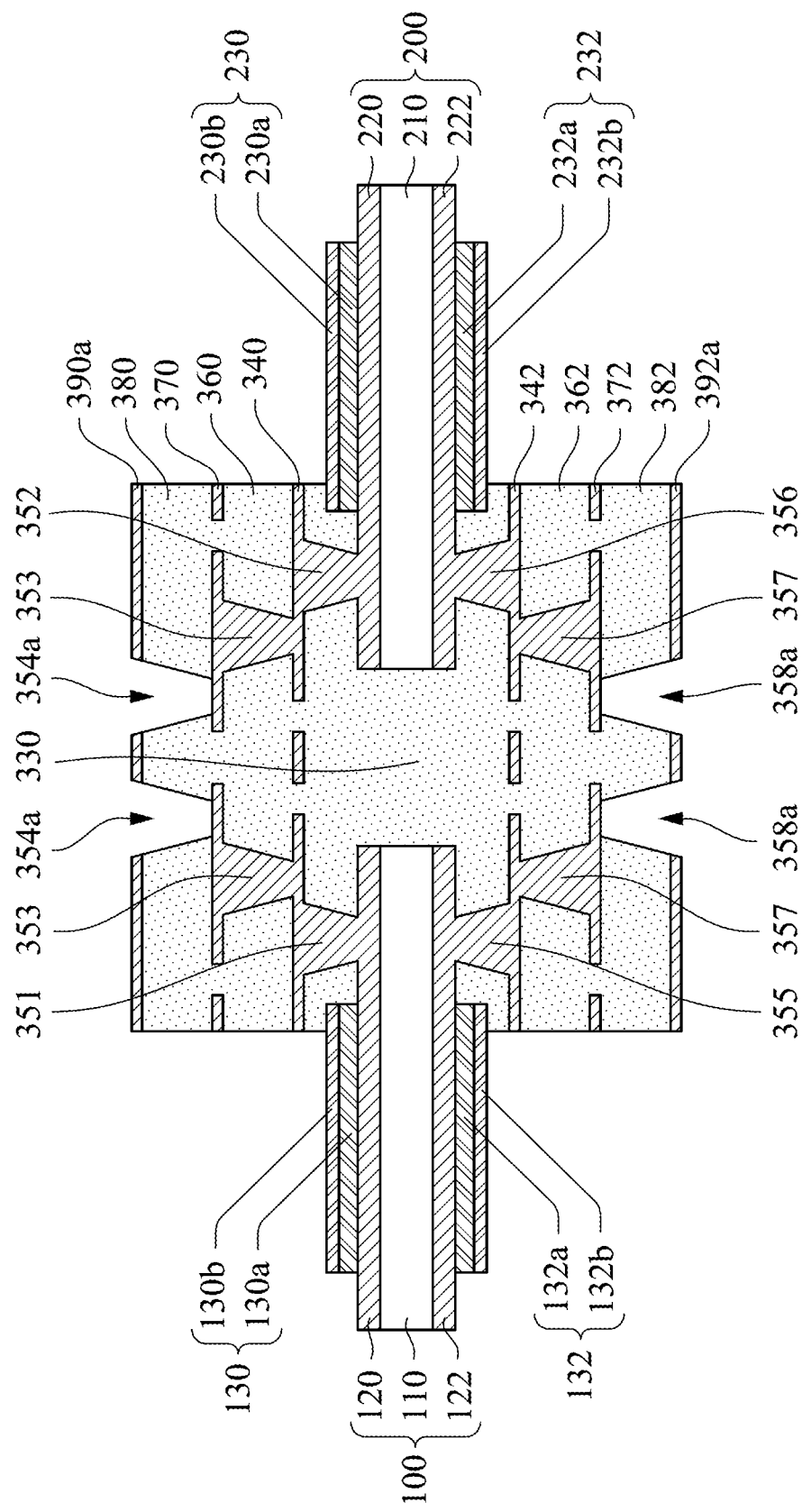

Next, step S60 is performed again. As shown in FIG. 13, a plurality of the fourth holes 354a are formed and penetrating through the fifth upper dielectric layer 380 and the third upper metal layer 390a to expose the second patterned upper metal layer 370. In some other embodiments, the repeated step S60 also includes forming a plurality of eighth holes 358a penetrating through the third lower metal layer 392a and the fifth lower dielectric layer 382 to expose the second patterned lower metal layer 372. The formation and materials of the fourth holes 354a and the eighth holes 358a are similar to those of the first hole 351a, and therefore are not repeated herein.

Figure 14:
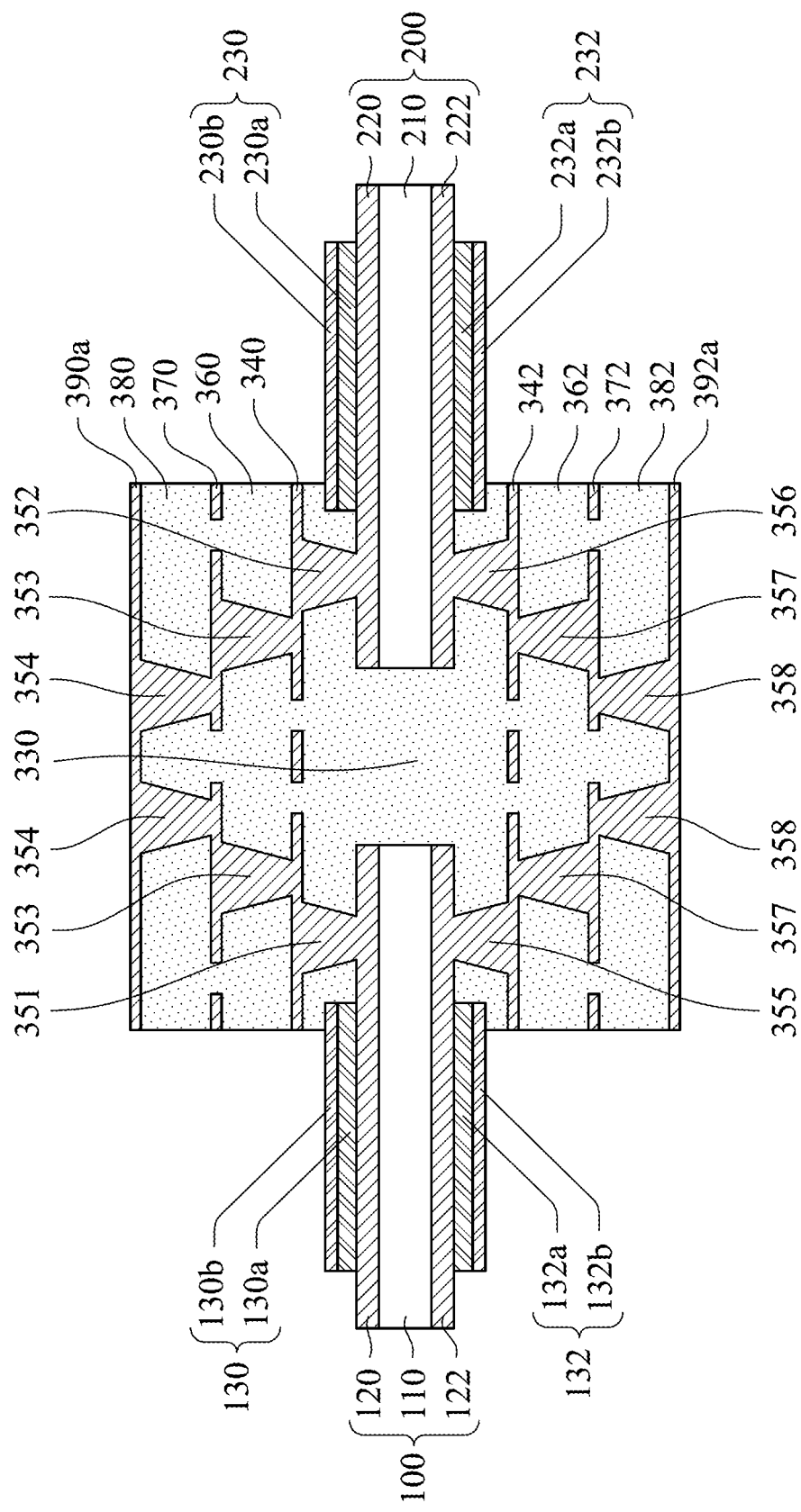

Next, step S70 is performed again. As shown in FIG. 14, a plurality of fourth conductive plugs 354 are formed and filling the fourth holes 354a. In some other embodiments, the repeated step S70 also includes forming a plurality of eighth conductive plugs 358 filling the eighth holes 358a. The formation and materials of the fourth conductive plugs 354 and the eighth conductive plugs 358 are similar to those of the first conductive plug 351, and therefore are not repeated herein.

Figure 15:
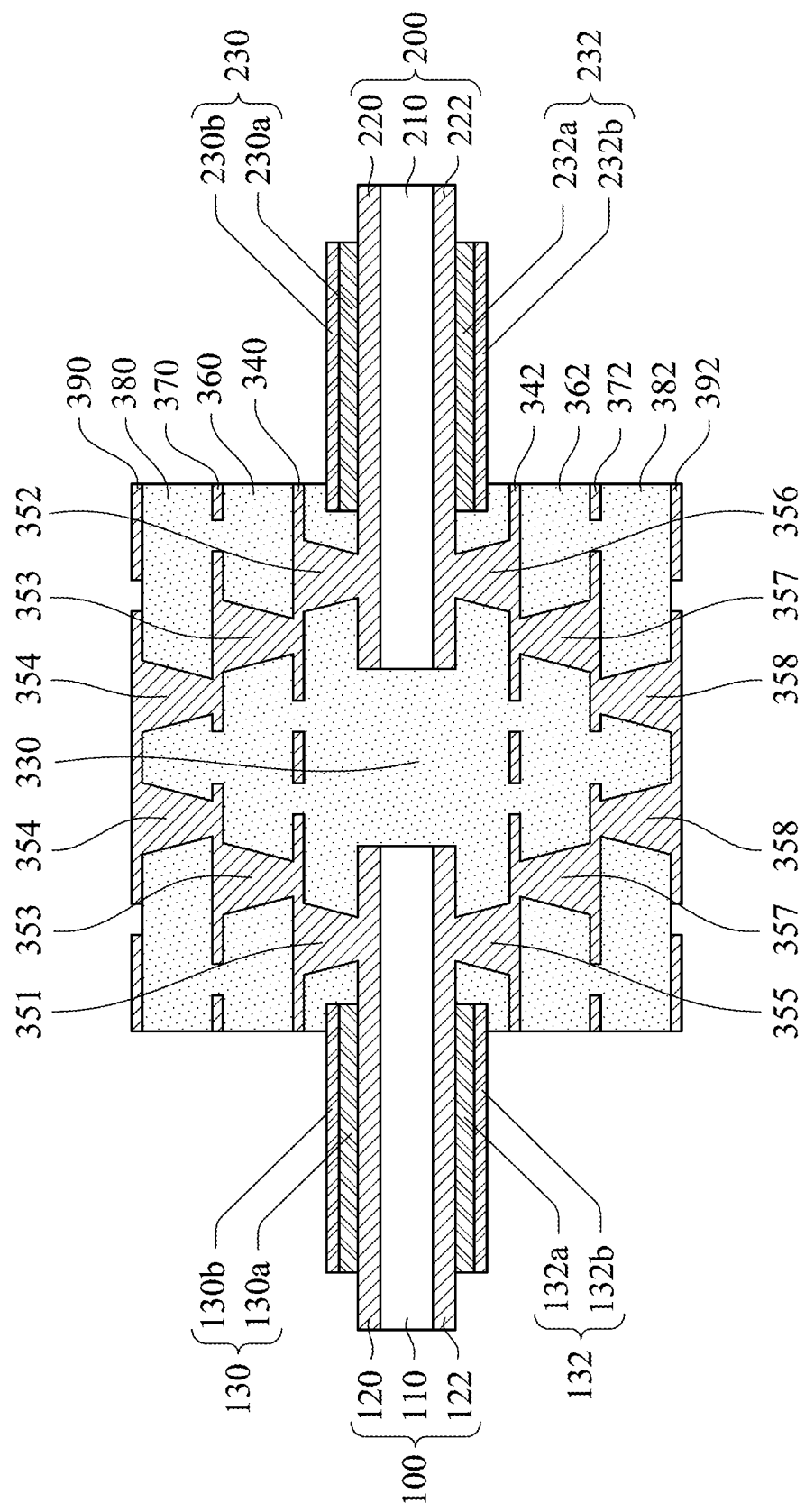

Next, step S80 is performed again. As shown in FIG. 15, the third upper metal layer 390a is patterned to form a third patterned upper metal layer 390. In some other embodiments, the repeated step S80 also includes patterning the third lower metal layer 392a to form a third patterned lower metal layer 392. The formation of the third patterned upper metal layer 390 and the third patterned lower metal layer 392 are similar to the formation of the first patterned upper metal layer 340, and therefore are not repeated herein.

It is noted that the number of dielectric layers and patterned metal layers shown in FIG. 15 are only schematic.

Those skilled in the art can appropriately select the desired number of the dielectric layer and the patterned metal layer according to actual needs.

Figure 16:
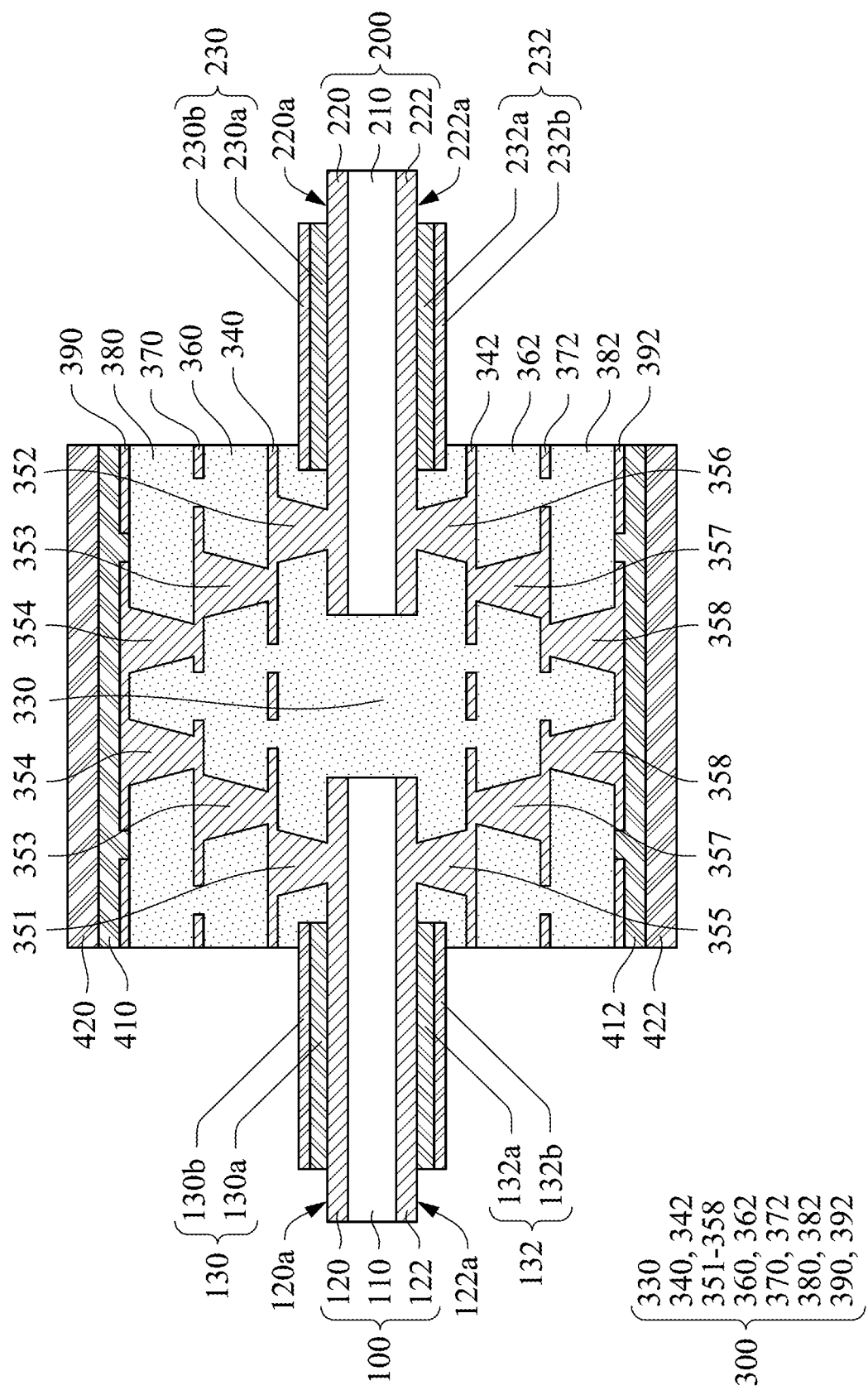

After the desired number of dielectric layer(s) and the desired number of patterned metal layer(s) are reached, method 20 further includes performing step S90. As shown in FIG. 16, a first shielding layer 420 is disposed over the third patterned upper metal layer 390. In one embodiment, the first shielding layer 420 is located on the sixth dielectric layer 410, and the third patterned upper metal layer 390 is covered by the sixth dielectric layer 410. In one embodiment, step S90 includes first disposing the sixth dielectric layer 410 on the third patterned upper metal layer 390, and then forming the first shielding layer 420 on the sixth dielectric layer 410. In another embodiment, step S90 also includes first disposing the seventh dielectric layer 412 on the third patterned lower metal layer 392, and then forming a second shielding layer 422 on the seventh dielectric layer 412.

The formation of the first shielding layer 420 and the second shielding layer 422 includes but not limited to coating or attaching a shielding material to the sixth dielectric layer 410 and the seventh dielectric layer 412. The shielding material has been described above, and therefore is not repeated herein. The formation and materials of the sixth dielectric layer 410 and the seventh dielectric layer 412 are similar or identical to those of the third dielectric layer 330, and therefore are not repeated herein.

In summary, the present disclosure provides a circuit board structure and a manufacturing method thereof. Compared to the conventional circuit board structure, the circuit board structure of the present disclosure has low signal transmission loss and is suitable for operation of high frequency and high speed circuit boards.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing circuit board structure, comprising:
providing a first flexible circuit board and a second flexible circuit board, the first flexible circuit board comprising a first dielectric layer and a first conductive circuit on the first dielectric layer, the second flexible circuit board comprising a second dielectric layer and a second conductive circuit on the second dielectric layer, wherein the first dielectric layer has a first dielectric loss value, and the second dielectric layer has a second dielectric loss value;
disposing a rigid board structure connecting the first flexible circuit board and the second flexible circuit board, wherein the rigid board structure comprises:
a third dielectric layer having a third dielectric loss value less than each of the first dielectric loss value and the second dielectric loss value, wherein the third dielectric loss value ranges from 0.001 to 0.002;
a first metal layer on the third dielectric layer; and
a first hole and a second hole both in the third dielectric layer and penetrating through the first metal layer to respectively expose the first conductive circuit and the second conductive circuit;
respectively forming a first conductive plug and a second conductive plug in the first hole and the second hole, the first conductive plug and the second conductive plug respectively connecting the first conductive circuit and the second conductive circuit;
patterning the first metal layer to form a first patterned metal layer;
forming a fourth dielectric layer and a second metal layer on the first patterned metal layer, wherein the fourth dielectric layer is located between the first patterned metal layer and the second metal layer;
forming a plurality of third holes penetrating through the fourth dielectric layer and the second metal layer to expose the first patterned metal layer;
forming a plurality of third conductive plugs filling the third holes; and
patterning the second metal layer to form a second patterned metal layer.

2. The method of claim 1, further comprising:
disposing a shielding layer over the first patterned metal layer after forming the first patterned metal layer.

3. The method of claim 1, wherein the first flexible circuit board further comprises a first cover layer partially covering the first conductive circuit, and a portion of the first cover layer is covered by the rigid board structure.

4. The method of claim 1, wherein the second flexible circuit board further comprises a second cover layer partially covering the second conductive circuit, and a portion of the second cover layer is covered by the rigid board structure.

* * * * *